TEMPERATURE STABILIZED BIASING CIRCUIT FOR TRANSISTOR HAVING ADDITIONAL INTEGRAL TEMPERATURE SENSITIVE DIODE

Filed Dec. 2, 1955

INVENTORS
ARTHUR D. EVANS AND
ROGER R. WEBSTER

BY Stevens, Davis, Miller and Mosher
ATTORNEYS 3,050,638

TEMPERATURE STABILIZED BIASING CIRCUIT FOR TRANSISTOR HAVING ADDITIONAL INTEGRAL TEMPERATURE SENSITIVE DIODE

Arthur D. Evans and Roger R. Webster, Dallas, Tex., assignors to Texas Instruments Incorporated, Dallas, Tex., a corporation of Delaware Filed Dec. 2, 1955, Ser. No. 550,541
2 Claims. (Cl. 307—88.5)

This invention relates to a method and means for extending the temperature range of satisfactory operation of transistor circuits in such a way that the power handling capabilities of the transistor are also increased. More particularly, the present invention relates to a method and means for compensating temperature induced shifts of transistor D.-C. bias currents from optimum operating levels.

It is well-known that nearly every parameter of semiconductor amplifier devices, called transistors, is temperature sensitive. Thus, increases in the operating temperature of a transistor will effect a decrease in the internal impedances of the unit resulting in bias current increases, impedance mis-matches in the external circuit, lower gain and lower power handling capabilities of the unit. Also, a transistor unit may be permanently damaged if the circuit in which it is used is so critical as to allow a cumulative action wherein the increase in bias current produces further heating of the bar resulting in an even greater increase in the bias current and more heating until the unit has exceeded its maximum permissible temperature causing permanent parameter changes.

Many temperature compensation schemes have been evolved using temperature sensitive elements in the external circuit. However, such schemes provide a counteraction for ambient temperature changes only, and the effects of temperature changes in the semiconductor material itself, i.e. the junction temperature changes which affect all transistors and particularly power transistors, remain uncompensated. The present invention, in order to overcome this deficiency, provides a diode element for use in temperature compensation of transistor circuits which is part of the transistor itself and which, consequently, is sensitive to the unit temperature as well as ambient temperature. The element has the further advantage of possessing a resistance-temperature characteristic almost identical to the transistor unit to be compensated.

Although the device of the present invention hereinafter described provides an excellent temperature compensation element for transistor circuits, it is by no means limited solely to this purpose because the diode element is electrically independent and inherently neither affects nor is affected by the transistor action in the bar of which it is a part. Thus the diode can also be used to replace external diodes of many circuits at a significantly lower over-all cost achieved through savings in manufacturing costs, handling, stocking costs, and installation costs.

Accordingly, it is one object of the present invention to provide a temperature compensation means for transistor circuits which is sensitive to the temperature of the semiconductor material of the transistor unit.

It is another object of the present invention to provide a transistor structure combining in one device an amplifier unit and one or more nonlinear impedance units, each electrically independent of the action of all of the others.

Further objects and details of the present invention are disclosed in the following description and accompanying drawings in which.

Although the n-p-n transistor configuration is used throughout the following description in the specific examples of the several embodiments of the present invention, it is to be understood that the present invention is in no way limited to the n-p-n configuration, for the principles disclosed herein may be applied as well to p-n-p, n-p-i-n, p-n-i-p and other transistor configurations.

Figures 1, 2, 6:
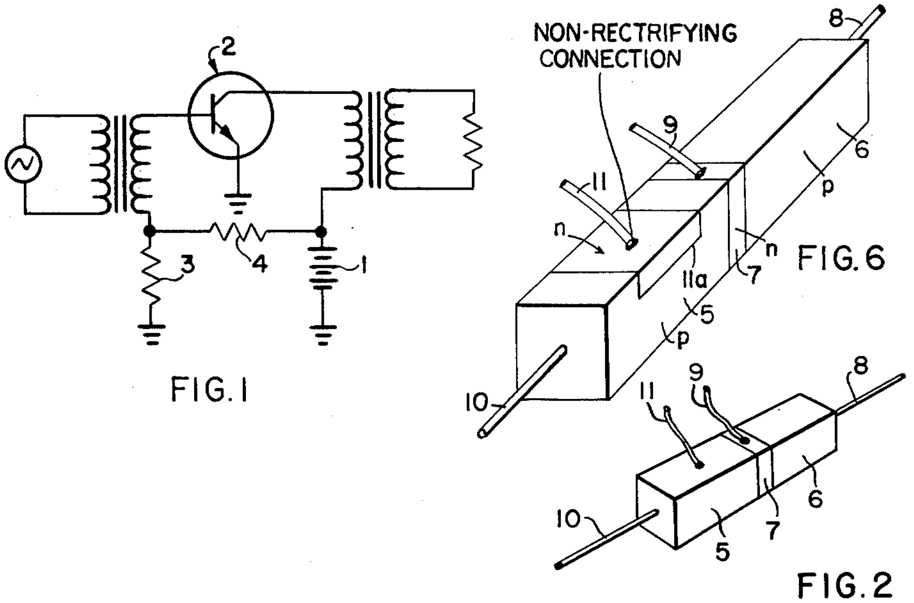
FIGURE 1 is a schematic diagram illustrating a common method for applying D.-C. bias currents to one type of transistor circuit.
FIGURE 2 illustrates the preferred embodiment of the semiconductor device of the present invention.
FIGURE 6 illustrates a further embodiment of the present invention.

With reference now to FIGURE 1, there is shown schematically a grounded emitter transistor circuit illustrating a typical biasing arrangement for an n-p-n junction transistor. Circuits of this type commonly use a single bias battery 1 with its positive terminal connected to the collector of the transistor 2 and the negative terminal conneced to the emitter. The base bias voltage is obtained from a voltage divider network of series resistors 3 and 4 between B+ voltage and ground. The resistor 3 is normally of a much lower value than the resistor 4. Therefore, changes in the base bias current flowing through resistor 3 have very little effect on the voltage at the base of the transistor and this voltage remains substantially constant. Temperature difficulties arise in such a circuit because the collector current and the amplification characteristics of this circuit are a function of the base-emitter current which, with a constant voltage applied, depends solely on the emitter-base resistance of the transistor unit. Each change in the junction temperature of the transistor, then, causes a change in the resistance of the junction and results in a shift of the base-emitter bias current from optimum value and a corresponding change in the characteristics of the circuit. Successful temperature compensation therefore must provide a means of maintaining a constant bias current through an emitter-base resistance varying with temperature.

One method of decreasing the effects of temperature on the bias current would be to shunt or replace the resistor 4 with a diode whose forward resistance temperature characteristic is similar or identical to that of the base-emitter junction of the transistor. However, if such an arrangement is to compensate for changes in the temperature of the semiconductor material of the transistor itself, the diode element must be maintained at the same temperature as that material. The device of the present invention provides a means of maintaining a diode element and a transistor element at exactly the same temperature by providing a single unit containing both elements.

Such a device is shown in FIGURE 2 illustrating a grown junction transistor of the conventional type having two relatively thick layers 5 and 6 of one conductivity type semiconductor material separated by a relatively thin layer 7 of an opposite type conductivity semiconductor material. In addition to the usual ohmic contacts 8, 9 and 10 for the collector, base and emitter layer leads respectively, a fourth contact 11 is provided to one of the layers, in this case the emitter. The contact 11 is formed as a rectifying contact by any of the several means to be described below and produces a diode whose temperature-resistance characteristic is nearly identical to that of the emitter-base diode of the transistor element of the device. This triode-diode transistor provides an excellent temperature compensated amplifier when connected as shown in FIGURE 3.

Figures 3, 4, 5:
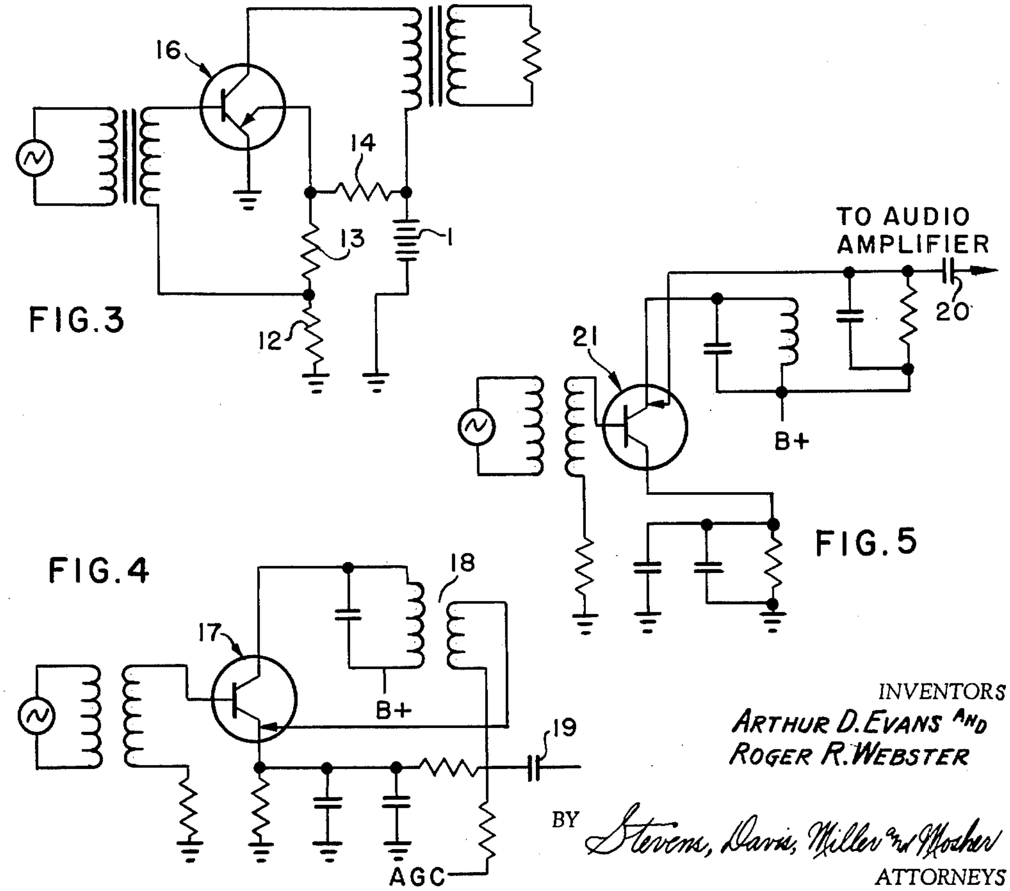
FIGURE 3 is a schematic diagram illustrating the use of the device of the present invention in a circuit to provide temperature compensation of the D.-C. bias currents in a transistor amplifier.
FIGURE 4 is a schematic diagram illustrating the use of the device of the present invention as a last IF amplifier and second detector of a transistor radio circuit.
FIGURE 5 is a schematic diagram illustrating a second embodiment of the present invention as used in another circuit for a combined last IF amplifier and second detector.

In the circuit of FIGURE 3, the collector of the transistor triode-diode 16 is connected to B+ voltage and the emitter, which is also the cathode of the diode element, is connected to ground exactly as in the circuit of FIGURE 1. However, in the voltage divider network of resistors 12, 13 and 14, the resistors 12 and 13 providing the base bias voltage are shunted by the diode element of the triode-diode. In such an arrangement, the voltage developed across the resistors 12 and 13 to ground is always identical to the voltage developed across the diode element shunting them. If the resistance of resistor 14 is high compared to that of the resistors 12 and 13 and the diode element, the current in the circuit will be determined almost solely by resistor 14 and will remain substantially constant. The voltage developed across the resistors 12 and 13 and across the diode element will be a function of the resistance of the diode and therefore a function of the temperature of the semiconductor material of the unit. Thus, the base bias voltage developed across the resistor 12 is an inverse function of the temperature of the material and the tendency of the base-emitter current to increase with temperature is counteracted by a decrease in the base bias voltage.

The circuit illustrated in FIGURE 3 presents merely one example of temperature compensation in transistor circuits using the device of the present invention. However, the triode-diode transistor disclosed herein can be used to improve the performance of many other well-known temperature compensated transistor circuits by merely substituting the triode-diode transistor of the present invention in the circuit and using the diode portion of the device as the temperature sensitive element of the circuit. In the manufacture of the device of the present invention, the rectifying contact may be produced by any of the several methods now well-known in the art. By way of specific example, a rectifying contact to n-type conductivity semiconductor material can be produced by placing a 99% gold-1% gallium alloy wire against the n-type material and heating the material until the tip of the wire melts and combines with the adjacent semiconductor material. Such is the preferred method when the semiconductor material is germanium. For n-type silicon, the preferred technique is the same, substituting an aluminum wire for the gold-gallium wire. It is to be understood that the present invention is by no means limited to the above described techniques but contemplates providing a transistor with an additional junction or junctions 11*a* acting as a diode element of the types generally referred to as grown junctions, alloyed junctions, diffused junctions, point contacts, and others (see FIGURE 6).

As mentioned before, the device of the present invention finds many advantageous uses other than temperature compensation. For example, the functions of the last IF amplifier and second detector are now performed by two separate devices in transistor radio circuits. The triode-diode transistor allows both of these functions to be performed by a single unit as shown in the schematic diagram of FIGURE 4. In the circuit of FIGURE 4, the incoming IF signal is coupled to the base of the transistor element of the triode-diode 17 and the amplified signal from the collector is coupled to the secondary of the transformer 18. In the secondary circuit of the transformer, the diode element of the transistor triode-diode 17 rectifies the IF signal and the resulting audio signal is fed through the coupling capacitor 19 to the next stage, for example an audio amplifier.

It will be noted that the schematic symbol for the triode-diode transistor 17 of FIGURE 4 is slightly different from the symbol used in FIGURE 3 for the triode-diode transistor 16. The difference in the symbol used indicates a difference in the physical placement of the rectifying contact on the transistor bar in the two units. The symbol of FIGURE 3 wherein the arrow designating the diode element is placed on the base side of the bend in the emitter lead line indicates a diode-triode unit in which the placement of the extra or rectifying contact is between the actual emitter lead 10 of FIGURE 2 and the base layer 7. In such an arrangement, the resistance of the portion of the bar between the rectifying contact and the emitter lead represents a small impedance common to both the diode circuit and the triode circuit and produces a slight coupling effect. This slight coupling is not detrimental to temperature compensation but may cause undesired feedback in the amplifier-detector circuit of FIGURE 4. However, the common resistance and the coupling effect is easily eliminated by placing the emitter lead connection to the bar closer to the base layer and attaching the rectifying contact near the end of the bar on the other side of the emitter lead. Such a physical arrangement is indicated by the schematic symbol of the transistor triode-diode 17 of FIGURE 4.

It is to be realized that the diode element of the triode-diode transistor of the present invention may be formed as a part of the collector layer instead of as a part of the emitter layer. The applicable methods of forming the contact are exactly the same in either case. Such an arrangement allows detection in the collector circuit of a combined last IF-second detector circuit as illustrated in the schematic diagram of FIGURE 5. In that circuit, the IF signal is fed to the base of the transistor unit 21 and the rectified (audio) signal is taken directly from the collector region through the diode element and coupled to the audio amplifier through the capacitor 20.

A further modification of the present invention provides a dual diode-triode transistor wherein two diode elements may be formed as part of the amplifier device by the same methods described above. Depending on the requirements of the circuit in which the unit is to be used, both of the diode elements may be formed on the emitter layer of the bar or both on the collector layer or one on the emitter layer and one on the collector layer.

The use of the diode-triode transistor of the present invention in the circuits mentioned above and, of course, in a great many others is advantageous in that the same circuit performance is achieved at a lower cost than is possible using separate diode and amplifier devices. For example, the combined unit uses less semiconductor material than the two separate units and, since only a single can or enclosure is used, other material requirements are also reduced. Further, only one item instead of two need be stocked by equipment manufacturers.

Thus, there has been disclosed a new transistor device combining in a single unit the functions which previously required two or more separate units and in addition provides a new function of temperature compensation in transistor circuits according to the temperature of the semiconductor material of the transistor itself.

Many changes and modifications still within the scope and spirit of the present invention will be apparent to those skilled in the art. It is, therefore, intended that the invention be limited only as set forth in the appended claims.

What is claimed is:

1. In a temperature compensated transistor circuit, a body of semiconductor material having a first region of one conductivty-type, a second region of the opposite conductivity-type defined in said body contiguous to said first region, a third region of said one conductivity-type defined in said body contiguous to said second region, said third region being spaced from said first region by less than a diffusion length for minority carriers whereby transistor action will be provided, a fourth region of said opposite conductivity-type defined in said body contiguous to said third region, said fourth region being spaced from said second region by greater than a diffusion length for minority carriers so that such minority carriers ejected into said third region from said fourth region will not reach said second region, voltage supply means having terminals of opposite polarity, a load impedance connected between one terminal of said voltage supply means and said first region whereby the junction between said first and second regions is back biased, the other terminal of said voltage supply means being connected to said third region, a voltage divider connected across said voltage supply means, said fourth region being connected to an intermediate point on said voltage divider, said second region being connected to another intermediate point on said voltage divider, and an input source connected in a closed series circuit with said second and third regions.

2. In a transistor circuit, a body of monocrystalline semiconductor material having a first region of one conductivity-type defined therein, a second region of the opposite conductivity-type defined in said body contiguous to said first region, a third region of said one conductivity-type defined in said body contiguous to said second region, said third region being spaced apart from said first region by a distance through said second region which is less than the diffusion length for minority carriers in said semiconductor material, a fourth region of said opposite conductivity-type defined in said body contiguous to said third region, said fourth region being spaced apart from said second region by a distance through said third region which is much greater than the diffusion length for minority carriers in said semiconductor material, voltage supply means having terminal means of opposite polarity, a load impedance connected between said first region and terminal means of said voltage supply means of one polarity, terminal means of the opposite polarity being connected to said third region, resistance means connecting terminal means of said voltage supply means of said one polarity to said second region whereby the junction between said third and second regions will be forward biased and the junction between said second and first regions will be reverse biased, and means connecting an intermediate point on said resistance means to said fourth region whereby the bias on said second region will be dependent upon the conductance of the junction between said fourth and third regions.

References Cited in the file of this patent

UNITED STATES PATENTS

| | | |
|---|---|---|
| 2,569,347 | Shockley | Sept. 25, 1951 |
| 2,570,978 | Pfann | Oct. 9, 1951 |
| 2,604,496 | Hunter | July 22, 1952 |
| 2,655,610 | Ebers | Oct. 13, 1953 |
| 2,662,976 | Pankove | Dec. 15, 1953 |
| 2,666,814 | Shockley | Jan. 19, 1954 |
| 2,676,271 | Baldwin | Apr. 20, 1954 |
| 2,709,787 | Kircher | May 31, 1955 |
| 2,779,877 | Lehovec | Jan. 29, 1957 |
| 2,852,677 | Shockley | Sept. 16, 1958 |
| 2,874,232 | Jochems | Feb. 17, 1959 |

OTHER REFERENCES

Hunter: "Handbook of Semiconductor Electronics," McGraw-Hill Book Co., 1956 (pages 4–18 and 4–19 relied on).